(12) United States Patent
Matsubara

(10) Patent No.: US 7,463,529 B2
(45) Date of Patent: Dec. 9, 2008

(54) WORD LINE DRIVING CIRCUIT PUTTING WORD LINE INTO ONE OF HIGH LEVEL, LOW LEVEL AND HIGH IMPEDANCE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 77 days.

(21) Appl. No.: 11/723,609

(22) Filed: Mar. 21, 2007

(65) Prior Publication Data

US 2007/0223283 A1    Sep. 27, 2007

(30) Foreign Application Priority Data

Mar. 22, 2006    (JP) .............................. 2006-078383

(51) Int. Cl.
*G11C 11/34* (2006.01)
(52) U.S. Cl. .............................. 365/185.23; 365/230.06; 365/63
(58) Field of Classification Search ............ 365/185.23, 365/230.06, 63
See application file for complete search history.

(56) References Cited

U.S. PATENT DOCUMENTS

| 5,506,816 | A | * | 4/1996 | Hirose et al. ............ 365/230.06 |
|---|---|---|---|---|
| 5,761,149 | A | | 6/1998 | Suzuki et al. |
| 5,764,585 | A | * | 6/1998 | Matsubara ............. 365/230.06 |
| 5,862,098 | A | * | 1/1999 | Jeong .................... 365/230.06 |
| 5,970,019 | A | * | 10/1999 | Suzuki et al. .......... 365/230.06 |
| 6,154,399 | A | | 11/2000 | Ogishima |
| 6,188,620 | B1 | | 2/2001 | Shibuya |
| 6,452,862 | B1 | * | 9/2002 | Tomotani ............... 365/230.06 |
| 6,564,331 | B1 | * | 5/2003 | Joshi ......................... 713/324 |
| 6,618,300 | B2 | | 9/2003 | Yamakoshi |
| 6,788,616 | B2 | * | 9/2004 | Takahashi ............. 365/230.01 |
| 7,385,871 | B2 | * | 6/2008 | Tomishima ............ 365/230.06 |

FOREIGN PATENT DOCUMENTS

| JP | 325793 | 2/1991 |
|---|---|---|
| JP | 9036328 | 2/1997 |
| JP | 2000100195 | 4/2000 |
| JP | 2000173290 | 6/2000 |
| JP | 2002100199 | 4/2002 |

* cited by examiner

*Primary Examiner*—Tuan T. Nguyen
(74) *Attorney, Agent, or Firm*—Young & Thompson

(57) ABSTRACT

A word line driving circuit has a main word driver for producing first and second main word driver output signals and a subsidiary word driver for driving a word line. The subsidiary word driver has a load transistor supplied with the first main word driver output signal and a driver transistor supplied with the second word driver output signal. The subsidiary word driver has a state putting circuit for putting the word line into one of a high level, a low level, and a high impedance state.

9 Claims, 5 Drawing Sheets

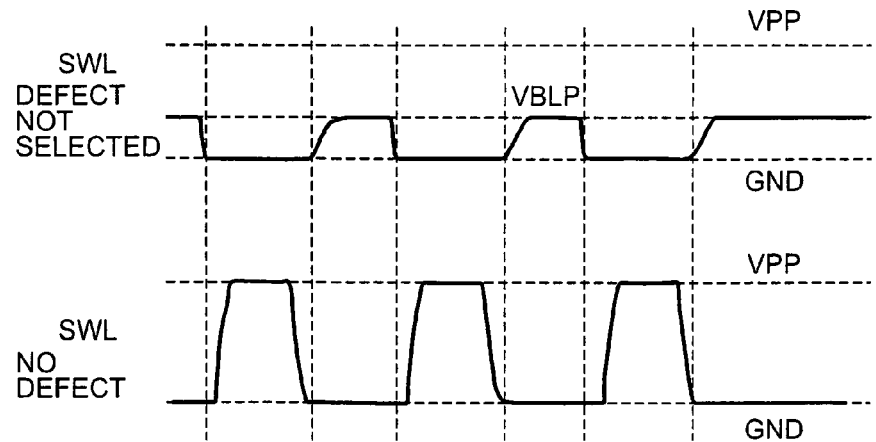
FIG. 8A SWL DEFECT NOT SELECTED
FIG. 8B SWL NO DEFECT
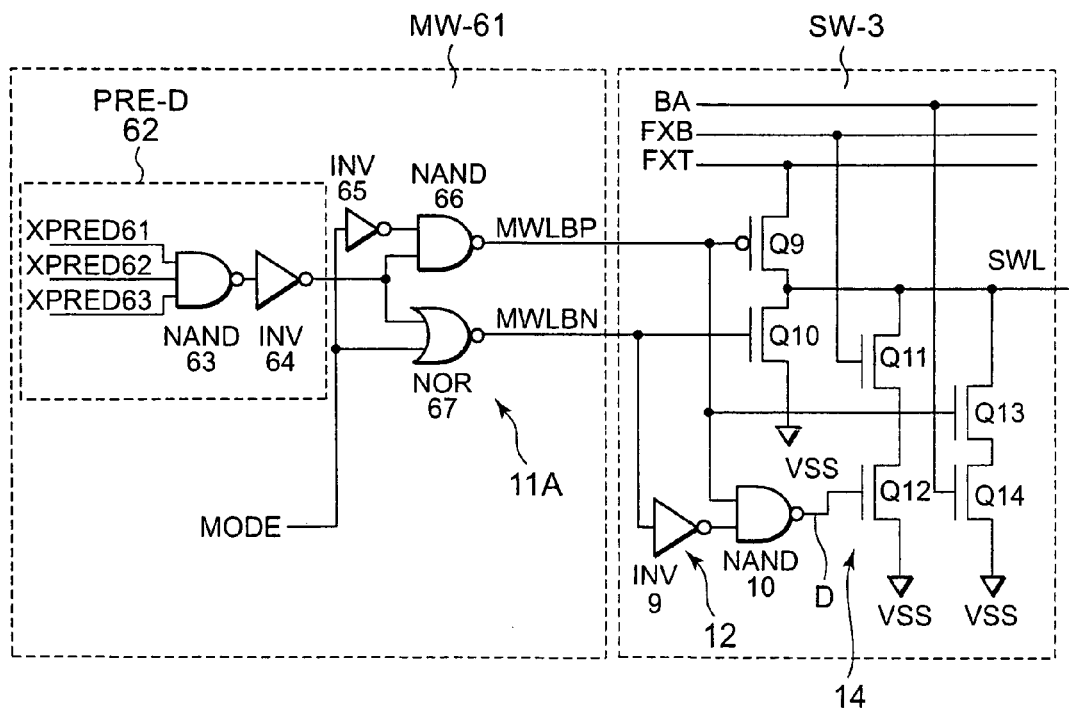
FIG. 9

WORD LINE DRIVING CIRCUIT PUTTING WORD LINE INTO ONE OF HIGH LEVEL, LOW LEVEL AND HIGH IMPEDANCE

This application claims priority to application JP 2006-78383, the disclosure of which is incorporated herein by reference.

BACKGROUND OF THE INVENTION

This invention relates to a semiconductor memory device and, in particular, to a semiconductor memory device including a word line driving circuit for driving a word line which is substituted by a redundancy circuit.

In recent years, a semiconductor element is moved to finer design rules and a semiconductor device is made on a large scale. More specifically, this trend is remarkable in a field of semiconductor memory devices. For example, in a Dynamic Random Access Memory (which is abbreviated as DRAM), a product having a memory capacity of 1 gigabits is developed and goes into actual use.

A large-capacity semiconductor memory device comprises not only a main memory array area where normal memory cell arrays are arranged but also a redundancy memory array area where a spare memory cell arrays are arranged. When a defect is found in a part of the main memory array area, a redundancy circuit substitutes a redundancy memory cell for a defective memory cell. By giving relief to the defective memory cell by the redundancy circuit, yields of a large scale semiconductor memory device are improved and the costs thereof is cut down.

However, the semiconductor memory device with the redundancy circuit gives rise to a problem as follows. When a short failure between a word line and a bit line occurs, a memory cell array in question is substituted by the redundancy circuit. However, in a defective memory cell array in a standby state, the word line has a potential equal to a ground potential VSS and the bit line has a potential equal to a precharge potential VBLP which is higher than the ground potential VSS. Therefore, a constant potential difference steadily keeps on applying to a short area in a standby state and there is a malfunction so as to flow a penetrating current in the short area.

In the manner which will later be described in conjunction with FIGS. 1 through 3, in a case where the word line is not selected in a state where a memory cell is standby, the word line becomes a low level and the bit line and an inverted bit line become the precharge potential. Accordingly, in a case where the short failure occurs between the word line and the bit line, a malfunction current flows from the bit line having the precharge potential to the word line having the low level. The malfunction circuit has a current value of about 25 µA per one short area of the word line and the bit line. For example, in the DRAM of 512 Mbits, there are two short areas of the word line and the bit line per a chip. Accordingly, the malfunction current of about 50 µA flows.

On the other hand, in DRAMs for use in portable devices that are called mobile DRAMs, it is desirable to decrease current consumption because of battery-powered. A consumed current spec of the standby state for low consumed current DRAMs has a dependence on temperature. In a case of the DRAM of 512 Mbits, the consumed current spec is equal to about 200 µm at room temperature of about 45° C. Accordingly, the malfunction current of 50 µA becomes 25% of the consumed current spec. Therefore, if measures are not taken against this, a major problem is created on production because the consumed current spec is over, yields are reduced, and it is unprofitable in cost. It is therefore desirable to reduce the malfunction current in the defective memory cell substituted by the redundancy circuit.

Various prior arts in relation to the redundancy circuit or the redundancy memory cell array are already known. By way of example, a patent document 1 (Japanese Unexamined Patent Publication of Tokkai No. 2002-100,199 or JP-A 2002-100199 which corresponds to U.S. Pat. No. 6,618,300) discloses a technical idea in which a redundant subsidiary word selection circuit is eliminated at every plate. In a semiconductor memory device disclosed in the patent document 1, a plurality of banks are arranged on a semiconductor substrate. A plurality of memory array groups are arranged on the plates. Redundant memory cell groups replace a memory cell array, including a defective memory cell, and are arranged at every plate. Subsidiary word selection circuits switch subsidiary word selection lines at every plate. Each of the subsidiary word selection circuits has a selection unit which selects a subsidiary word selection line on the plate belonging thereto and a redundant subsidiary word selection line of the redundant memory cell array arranged on the other adjacent plate.

Furthermore, a patent document 2 (Japanese Unexamined Patent Publication of Tokkai No. Hei 9-36,328 or JP-A 9-36328 which corresponds to U.S. Pat. No. 5,761,149) discloses a technical idea in which a current leakage is not produced in a stand-by state of the DRAM. In a DRAM disclosed in the patent document 2, the DRAM is provided with a main word line; a plurality of subsidiary word lines which are arranged in the direction of bit lines crossing the main word line and to which a plurality of dynamic memory cells are connected; a plurality of subsidiary word selection lines which extended so as to perpendicular intersect the main word line and through which a selection signal for selecting one of the plurality of subsidiary word lines is transmitted; and a logic circuit for receiving a selection signal from the main word line and a selection signal from each of the subsidiary word selection lines to thereby form a selection signal for selecting one of the subsidiary word lines. In the DRAM, the voltage level of each of the main word line and the subsidiary word selection line is made to equal to the ground potential when the line is in a not-selected state.

A patent document 3 (Japanese Unexamined Patent Publication of Tokkai No. 2000-173,290 or JP-A 2000-173290 which corresponds to U.S. Pat. No. 6,188,620) disclose a selection method of a redundancy word driver and a main word driver. A semiconductor memory device disclosed in the patent document 3 includes the redundancy word driver to select a redundancy memory cell and the main word driver to select a normal memory cell. It is judged on the basis of an address input whether a redundancy memory cell or a main word is selected and thereby a time to drive a word line is shortened. In a redundancy judgment circuit, control signals RDC0 to activate redundancy word drivers and a control signal XDC to activate a main word driver are produced, by using dynamic NOR circuits and a dynamic AND circuit that can each set an initial state of an output signal thereof regardless of an input signal, wherein the control signals RDC and XDC in initial states are respectively set to levels at which the redundancy word drivers and main word driver are all inactive.

A patent document 4 (Japanese Unexamined Patent Publication of Tokkai No. 2000-100,195 or JP-A 2000-100195 which corresponds to U.S. Pat. No. 6,154,399) discloses a semiconductor storage device having a redundancy circuit. The semiconductor storage device disclosed in the patent document 4 can provide an enhanced rate of defective sub-word line replacement by independently controlling the activation and deactivation of redundancy sub-word lines. Redundancy sub-word lines can be connected to different redundancy sub-word drivers. Sub-word selecting circuits can generate 2-bit redundancy sub-word selecting signals from sub-word selecting signals and fuse output signals received from a fuse circuit. Redundancy sub-word selecting signals can independently active and inactive redundancy sub-word lines coupled to redundancy sub-word drivers.

A patent document 5 (Japanese Unexamined Patent Publication of Tokkai No. Hei 3-25,793 or JP-A 3-25793) discloses a semiconductor memory device comprising a memory cell array, means for selecting memory cells in the memory cell array, and a tristate output circuit for outputting readout data. The memory cell array is divided into a plurality of subsidiary memory arrays. One word is divided into a plurality of sub-words. Each of the sub-words is selected by a corresponding to sub-word control signal.

However, the above-mentioned prior art patent documents 1 to 5 neither describe nor understand a problem for the malfunction current in the defective memory cell. Accordingly, inasmuch as the problem is not understood, the above-mentioned prior art patent documents 1 to 5 never teach technique for resolving the problem.

SUMMARY OF THE INVENTION

It is an object of this invention to provide a semiconductor memory device including a word line driving circuit in which a leakage current doer not occur in a defective memory cell substituted by a redundancy circuit.

Other objects of this invention will become clear as the description proceeds.

According to an aspect of this invention, a semiconductor memory device comprises a memory cell connected to a word line and a bit line, and a word line driving circuit for driving the word line. The word line driving circuit comprises a main word decoder for producing first and second main word decoder output signals and a subsidiary word decoder including a load transistor and a driver transistor. The load transistor has a gate supplied with the first main word decoder output signal. The driver transistor has a gate supplied with the second main word decoder output signal. The subsidiary word decoder comprises a state putting circuit for putting the word line into one of a high level, a low level, and a high impedance state.

BRIEF DESCRIPTION OF THE DRAWING

FIGS. 8A and 8B show waveforms of a word line in the semiconductor memory device illustrated in FIG. 4 in a care where there is a short failure; and FIG. 9 is a circuit diagram of a word line driving circuit for use in a semiconductor memory device according to a second embodiment of this invention.

DESCRIPTION OF THE PREFERRED EMBODIMENTS

Figure 1:
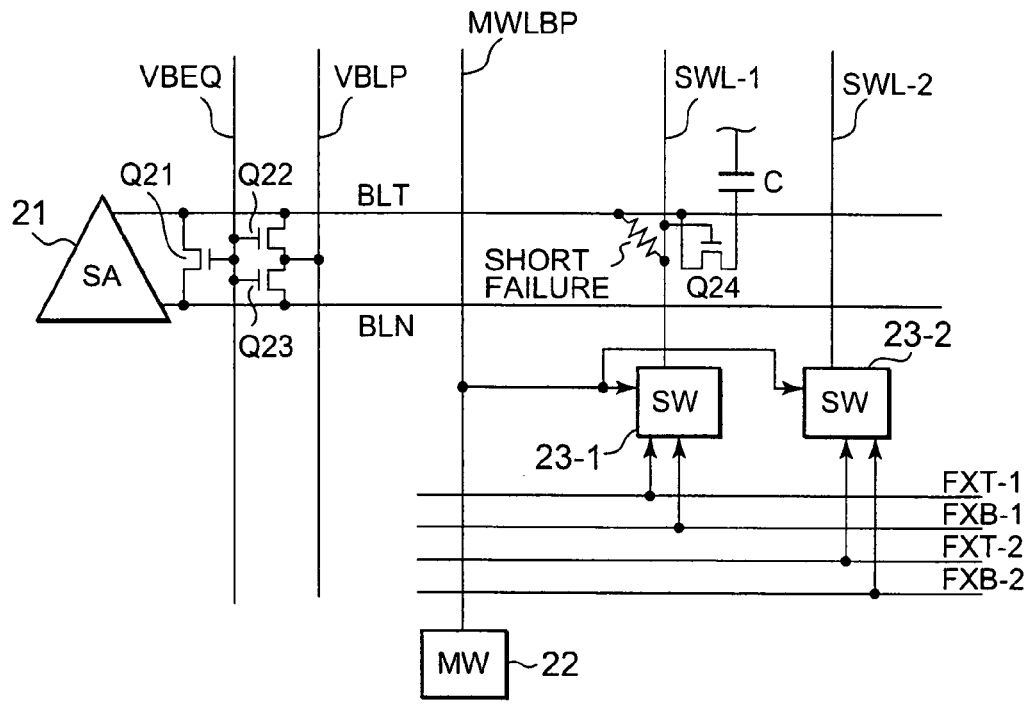
FIG. 1 is a block diagram showing the periphery of a memory cell array in a conventional semiconductor memory device.
Figure 2:
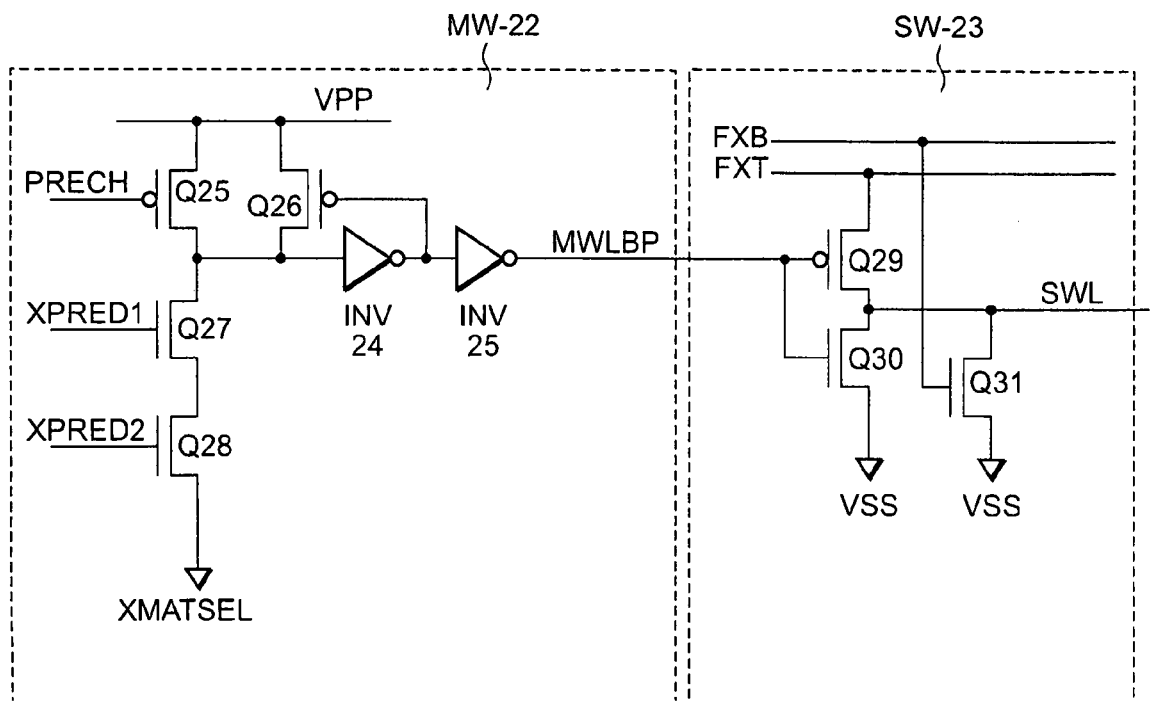
FIG. 2 is a circuit diagram of a word line driving circuit for use in the conventional semiconductor memory device illustrated in FIG. 1.
Figure 3:
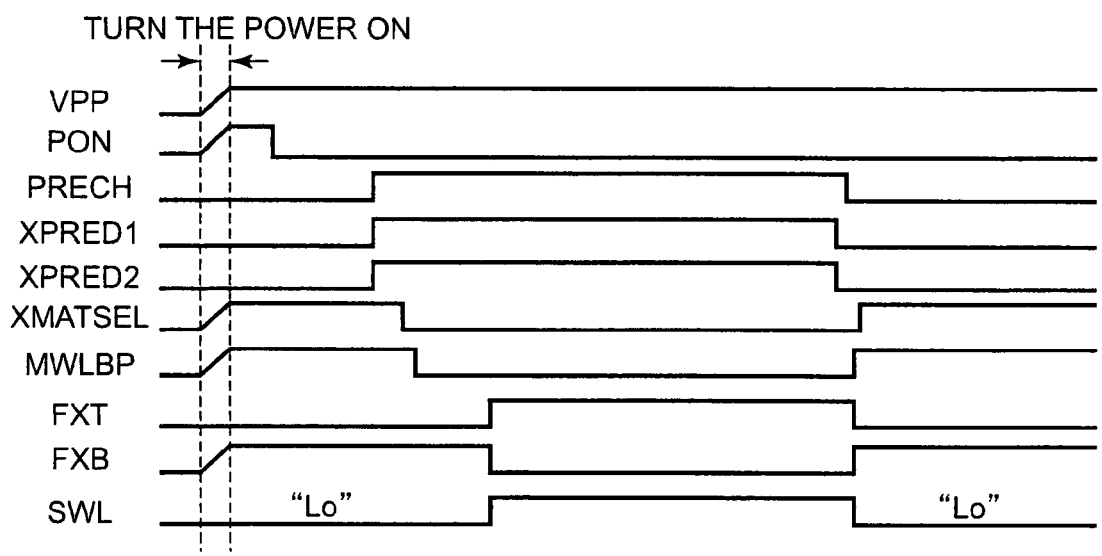
FIG. 3 is a time chart for describing operation of the conventional semiconductor memory device illustrated in FIG. 1 in a case where there is no short failure.

Referring to FIGS. 1 through 3, the description will proceed to a conventional semiconductor memory device at first in order to facilitate an understanding of a semiconductor memory device according to the present invention. FIG. 1 is a block diagram showing the periphery of a memory cell array. FIG. 2 is a circuit diagram of a word line driving circuit for use in the semiconductor memory device illustrated in FIG. 1. FIG. 3 is a time chart for use in describing operation of the semiconductor memory device illustrated in FIG. 1.

The semiconductor memory device comprises a sense amplifier (SA) 21, a main word driver (MW) 22, first and second subsidiary word drivers (SWs) 23-1 and 23-2, N-channel transistors Q21, Q22, and Q23, and a memory cell which will presently be described.

The memory cell is connected to a first word line SWL-1 and a bit line BLT. The memory cell comprises a cell transistor Q23 and a capacitor C. The cell transistor Q24 has a gate connected to the first word line SWL-1 and a drain connected to the bit line BLT. The sense amplifier (SA) 21 amplifies a potential difference between the bit line BLT and an inverted bit line BLN. For a standby duration, the bit line BLT and the inverted bit line BLN are held in a pre-charge potential VBLP because the N-channel transistors Q21, Q22, and Q23 are activated by a bit line equalizing signal VBLP. That is, the bit line BLT and the inverted bit line BLN are charged in the pre-charge potential VBLP for a duration when the word line is not selected (i.e. a duration when the word line is put into a standby state).

The first and second word lines SWL-1 and SWL-2 are selected and activated by the first and the second subsidiary word decoders (SWs) 23-1 and 23-2, respectively. Responsive to a main word decoder output signal MWLBP from the main word decoder (MW) 22, a first word line start-up signal FXT-1, and a first inverted word line start-up signal FXB-1, the first subsidiary word decoder (SW) 23-1 operates. Responsive to the main word decoder output signal from the main word decoder (MW) 22, a second word line start-up signal FXT-2, and a second inverted word line start-up signal FXB-2, the second subsidiary word decoder (SW) 23-2 operates. When the main word decoder output signal MWLBP from the main word decoder (MN) 22 takes a low level and the first word line start-up signal FXT-1 takes a high level, the first word line SWL-1 is selected and becomes a high level.

As shown in FIG. 2, the word line driving circuit comprises the main word decoder (MW) 22 and the subsidiary word driver (SW) 23. The main word decoder (MW) 22 comprises two P-channel transistors Q25 and Q26, two N-channel transistors Q27 and Q28, and two inverter circuits (INVs) 24 and 25. Between a power supply potential VPP and a group selection signal XMATSEL, the P-channel transistor Q25, the N-channel transistor Q27, and the N-channel transistor Q28 are connected in series in the order from the power supply side. The P-channel transistor Q25 has a gate supplied with a precharge signal PRECH. The N-channel transistor Q27 has a gate supplied with a first X-address predecoder output signal XPRED1. The N-channel transistor Q28 has a gate supplied with a second X-address predecoder output signal XPRED2.

The P-channel transistor Q26 has a source and a drain which are connected to a source and a drain of the P-channel transistor Q25 in common. The source of the P-channel transistor Q26 is connected to the power supply VPP. The gate of the P-channel transistor Q26 is connected to an output terminal of the inverter circuit (INV) 24. The drains of the P-channel transistors Q25 and Q26 are connected to an input terminal of the inverter circuit (INV) 24. The output terminal of the inverter circuit (INV) 24 is connected to an input terminal of the inverter circuit (INV) 25. The inverter circuit (INV) 25 has an output terminal for producing the main word decoder output signal MWLBP of the main word decoder (MW) 22.

The subsidiary word decoder (SW) 23 comprises a P-channel transistor Q29 and two N-channel transistors Q30 and Q31. The subsidiary word decoder (SW) 23 is supplied with the main word decoder output signal MWLBP from the main word decoder (MW) 22, a word line start-up signal FXT, and an inverted word line start-up signal FXB. The selected word line SWL is activated to the high level. Between the word line start-up signal FXT and a ground potential VSS, an inverter circuit consisting of the P-channel transistor Q29 and the N-channel transistor Q30 is inserted. The main word decoder output signal MWLBP of the main word decoder (MW) 22 is supplied to gates of the P-channel transistor Q29 and of the N-channel transistor Q30. The P-channel transistor Q29 and the N-channel transistor Q30 have drains which are connected to the word line (SWL). The N-channel transistor Q31 is connected between the word line (SWL) and the ground potential VSS. The N-channel transistor Q31 has a gate supplied with the inverted word line start-up signal FXB.

Referring to FIG. 3, description will be made as regards operation of the conventional semiconductor memory device in a case where there is no short failure, that is, a state where the word line is selected in a normal operation.

The main word decoder (MW) 22 is supplied with the precharge signal PRECH of a high level, the first X-address predecoder output signal XPRED1 of a high level, the second X-address predecocer output signal XPRED2 of a high level, and the group selection signal XMATSEL of a low level. Inasmuch as the P-channel transistor Q25 is turned off and the N-channel transistors Q27 and Q28 are turned on, the input terminal of the inverter circuit (INV) 24 becomes a low level. The output terminal of the inverter (INV) 24 becomes a high level and the main word decoder output signal MWLBP of the inverter circuit (INV) 25 has a low level.

The subsidiary word decoder (SW) 23 is supplied with the main word decoder output signal MWLBP of the low level, the word line start-up signal FXT of a high level, and the inverted word line start-up signal FXB of a low level. Inasmuch as the P-channel transistor Q29 is turned on and the N-channel transistors Q30 and Q31 are turned off, the word line SWL is activated to the high level. While the memory cell is active, the precharge signal PRECH becomes the high level (the bit line equalizing signal VBEQ becomes a low level). When the first and the second X-address predecoder output signals XPRED1 and XPRED2 and the word line start-up signal FXT selected as an address become the high level, the word line SWL is selected. In a case where the word line SWL is selected, the main word decoder output signal MWLBP of the main word decoder 22 becomes the low level and the word line (SWL) becomes the high level. In a case where the word line is not selected, the main word decoder output signal MWLBP of the main word decoder 22 become a high level and the word line (SWL) becomes a low level.

In the manner which is described above, in a case where the word line (SWL) is not selected in a state where the memory cell is standby, the word line (SWL) becomes the low level and the bit line BLT and the inverted bit line BLN become the precharge potential VBLP. Accordingly, in a case where a short failure occurs between the word line and the bit line, a malfunction current flows from the bit line BLT of the precharge potential to the word line (SWL) of the low level. The malfunction circuit has a current value of about 25 µA per one short area of the word line and the bit line. For example, in a dynamic random access memory (DRAM) of 512 Mbits, there are two short areas of the word line and the bit line per a chip. Accordingly, the malfunction current of about 50 µA flows.

On the other hand, in DRAMs for use in portable devices that are called mobile DRAMs, it is desirable to decrease current consumption because of battery-powered. A consumed current spec of the standby state for low consumed current DRAMs has a dependence on temperature. In a case of the DRAM of 512 Mbits, the consumed current spec is equal to about 200 µm at room temperature of about 45° C. Accordingly, the malfunction current of 50 µA becomes 25% of the consumed current spec. Therefore, if measures are not taken against this, a major problem is created on production because the consumed current spec is over, yields are reduced, and it is unprofitable in cost. It is therefore desirable to reduce the malfunction current in a bad cell for which a redundancy circuit is substituted, as mentioned in the preamble of the instant specification.

Figure 4:
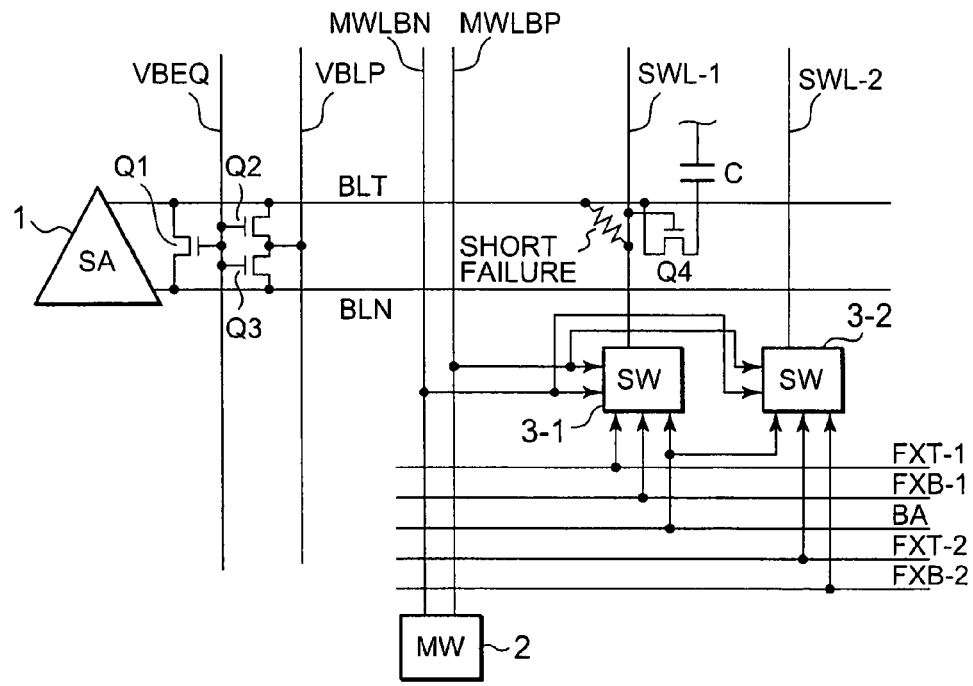
FIGS. 4 is a block diagram showing the periphery of a memory cell array in a semiconductor memory device according to a first embodiment of this invention.
Figure 5:
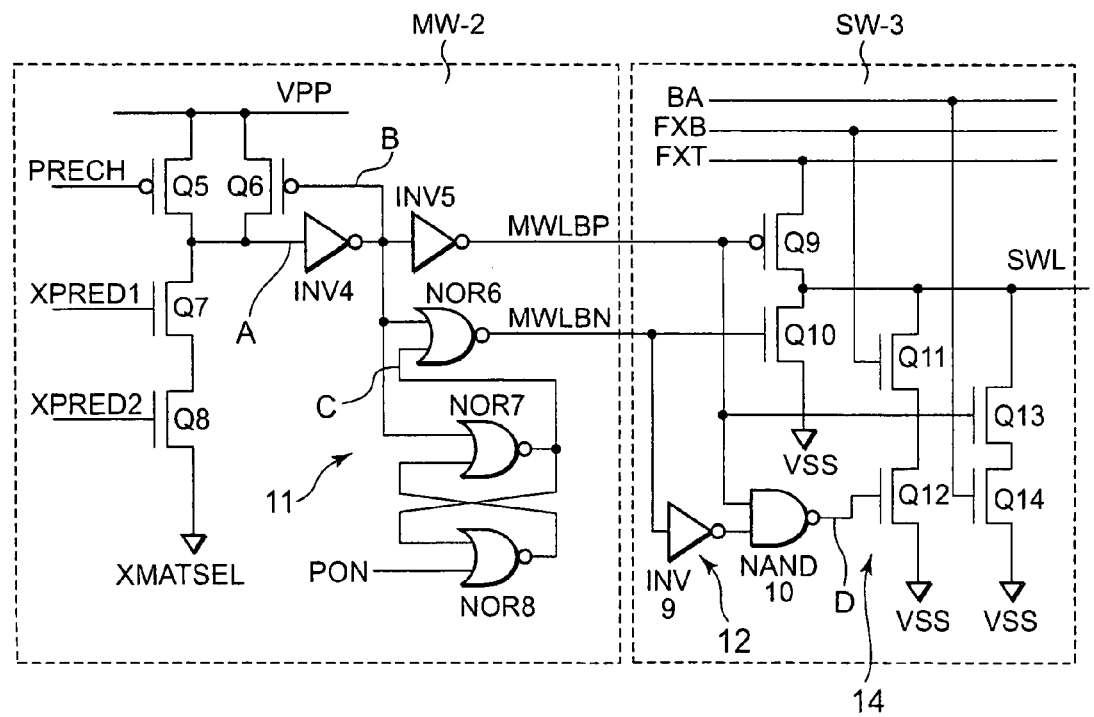
FIG. 5 is a circuit diagram of a word line driving circuit for use in the semiconductor memory device illustrated in FIG. 4.
Figure 6:
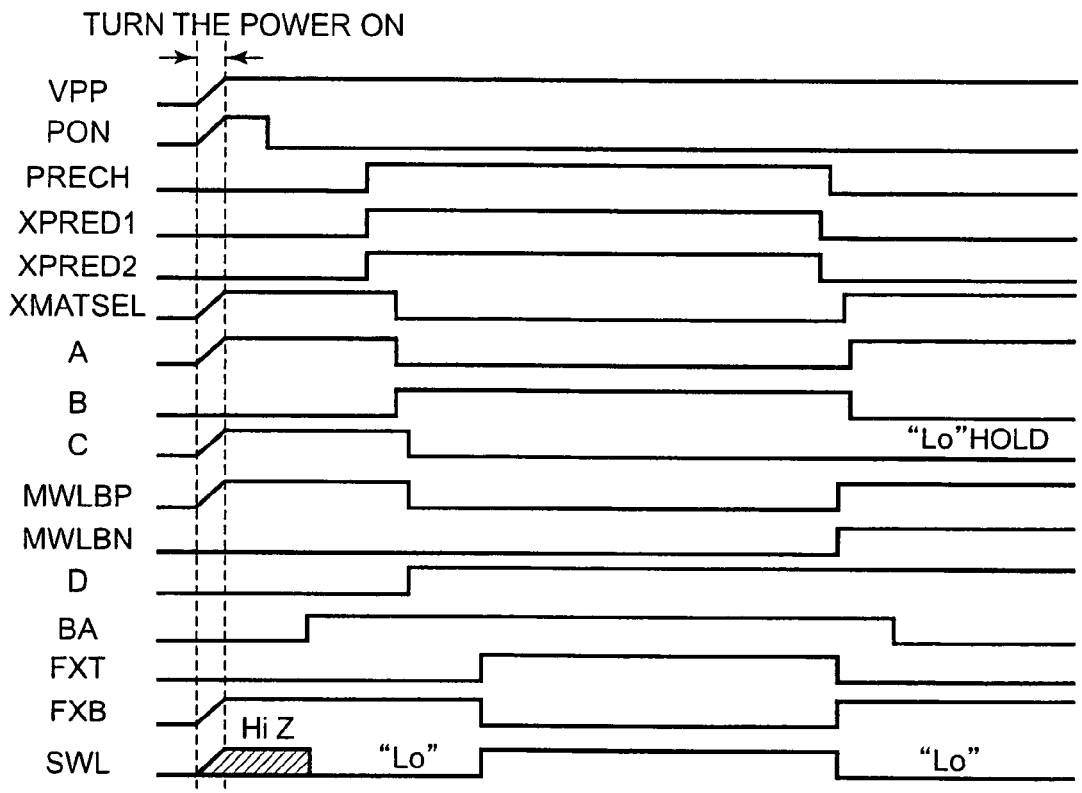
FIG. 6 is a time chart for describing operation of the semiconductor memory device illustrated in FIG. 4 in a care where there is no short failure.
Figure 7:
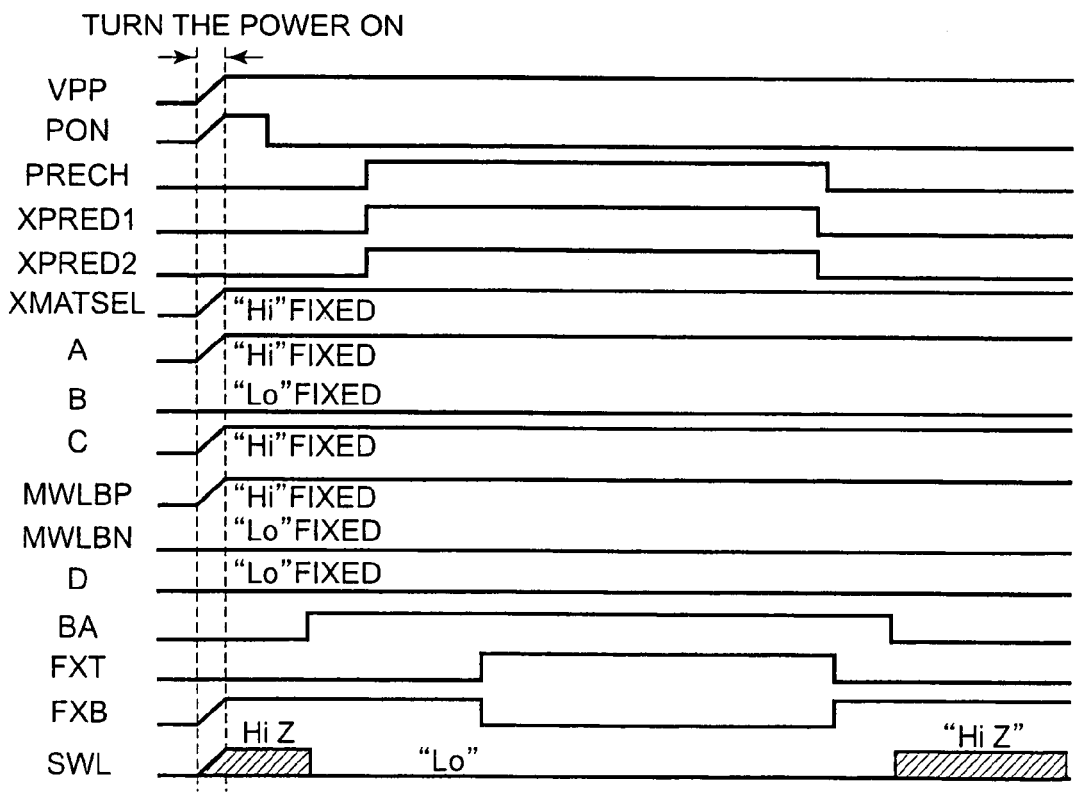
FIG. 7 is a time chart for describing operation of the semiconductor memory device illustrated in FIG. 4 in a care where there is a short failure.

Referring to FIGS. 4 through 8, the description will proceed to a semiconductor memory device according to a first embodiment of this invention. FIG. 4 is a block diagram of the periphery of a memory cell array including a main word decoder and subsidiary word decoders. FIG. 5 is a circuit diagram of the word line driving circuit comprising the main word decoder (MN) depicted at 2 and the subsidiary word decoder (SW) depicted at 3. FIG. 6 shows a time chart for use in describing operation of the semiconductor memory device in a case where there is no short failure in a word line. FIG. 7 shows a time chart for use in describing operation of the semiconductor memory device in a case where there is a short failure in the word line. FIGS. 8A and 8B collectively show waveforms of the word line in a case where there is the short failure in the word line. It will be assumed that a redundancy circuit according to this invention is substituted for word line unit (word group) selected by the main word decoder.

Referring to FIG. 4, the description will be made as regards structure of the surroundings of the memory cell array. The semiconductor memory device comprises a sense amplifier (SA) 1, the main word decoder (MN) 2, first and second subsidiary word decoders (SWs) 3-1 and 3-2, N-channel transistors Q1, Q2, and Q3, and a memory cell which will presently be described.

The memory cell comprises a cell transistor Q4 and a cell capacitor C. The memory cell is connected to a first word line SWL-1 and a bit line BLT. The cell transistor Q4 has a gate connected to the first word line SWL-1. The bit line BLT of the memory cell is connected to the sense amplifier (SA) 1. The sense amplifier (SA) 1 amplifies a potential difference between the bit line BLT and an inverted bit line BLN. For an inactive duration, the bit line BLT and the inverted bit line BLN are held to charge to a precharge potential VBLP because the N-channel transistors Q1, Q2, and Q3 are activated by a bit line equalizing signal VBEQ.

The first and second word line SWL-1 and SWL-2 are selected and activated by the first and the second subsidiary word decoders (SWs) 3-1 and 3-2, respectively. The first subsidiary word decoder (SW) 3-1 operates in response to first and second main word decoder output signals MWLBP and MWLBN of the main word decoder (MW) 2, a bank address BA, a first word line start-up signal FXT-1 and a first inverted word line start-up signal FXB-1. The second subsidiary word decoder (SW) 3-2 operates in response to the first and the second main word decoder output signals MWLBP and MWLBN of the main word decoder (MW) 2, the bank address BA, a second word line start-up signal FXT-2 and a second inverted word line start-up signal FXB-2. The first word line start-up signal FXT-1 and the first inverted word line start-up signal FXB-1 are signals for selecting the first subsidiary word decoder (SW) 3-1. Likewise, the second word line start-up signal FXT-2 and the second inverted word line start-up signal FXB-2 are signals for selecting the second subsidiary word decoder (SW) 3-2. Selected by the main word decoder and the subsidiary word decoder, the word line SWL is activated to access the memory cell array connected the word line. In the whole of description, the first and the second word lines SWL-1 and SWL-2 are collectively called a word line SWL, the first and the second subsidiary word decoders (SWs) 3-1 and 3-2 are collectively called the subsidiary word decoder (SW) 3, the first and the second word line start-up signals FXT-1 and FXT-2 are collectively called a word line start-up signal FXT, and the first and the second inverted word line start-up signals FXB-1 and FXB-2 are connectively call an inverted word line start-up signal.

In FIG. 5, the main word decoder (MW) 2 comprises two P-channel transistors Q5 and Q6, two N-channel transistors Q7 and Q8, two inverter circuit (INV) 4 and 5, and three NOR circuits (NOR) 6, 7, and 8. The P-channel transistor Q5 and the two N-channel transistors Q7 and Q8 are connected in series between a high-level side power supply VPP and a group selection signal XMATSEL in this order. The group selection signal XMATSEL is an address selection signal for selecting one of main word decoder group which is a set of main word decoders. The group selection signal XMATSEL according to this invention is the address selection signal with information indicating whether or not the redundancy circuit is substituted. On turning the power of the semiconductor memory device on, when the redundancy circuit is substituted by an address comparison result of the redundancy circuit, the group selection signal XMATSEL is fixed to a high level.

The P-channel transistor Q5 has a gate supplied with a precharge signal PRECH, the N-channel transistor Q7 has a gate supplied with a first X-address predecoder output signal XPRED1 to which an address signal is decoded, the N-channel transistor Q8 has a gate supplied with a second X-address predecoder output signal XPRED2. The P-channel transistor Q6 has a source and a drain which are connected to a source and a drain of the P-channel transistor Q5 in common. The P-channel transistor Q6 has a gate connected to an output terminal of the inverter circuit (INV) 4. The sources of the P-channel transistors Q5 and Q6 are connected to the high-level side power supply VPP. The drains of the P-channel transistors Q5 and Q6 are connected to a node A. The node A is connected to an input terminal of the inverter circuit (INV) 4. The inverter circuit (INV) 4 has an output terminal connected to a node B which is connected to the input terminal of the inverter circuit (INV) 5. The inverter circuit (INV) 5 has an output terminal for delivering the first main word decoder output signal MWLBP of the main word decoder (MW) 2 to the subsidiary word decoder (SW) 3.

The NOR circuit (NOR) 6 is supplied with an output signal from the inverter circuit (INV) 4 and with an output signal from the NOR circuit (NOR) 7. The NOR circuit (NOR) 6 delivers the second main word decoder output signal MWLMB of the main word decoder (MW) to the subsidiary word decoder (SW) 3. The NOR circuit (NOR) 7 is supplied with an output signal of the inverter circuit (INV) 4 and with an output signal of the NOR circuit (NOR) 8. The NOR circuit (NOR) 7 has an output terminal connected to a node C. The NOR circuit (NOR) 7 delivers an output signal to the NOR circuits (NORs) 6 and 8. The NOR circuit (NOR) 8 is supplied with the output signal of the NOR circuit 7 and with a start-up reset signal PON which is started only on turning the power on. The NOR circuit (NOR) 8 delivers the output signal to the NOR circuit (NOR) 7.

A combination of the inverter circuits 4 and 5 and the NOR circuits 6, 7, and 8 serves as a logic processing circuit 11 for performing logic processing on the predecoder output signals XPRED1 and XPRED2 on the basis of the selection signal XMATSEL to produce the first and the second main word decoder output signals MWLBP and MWLBN. In the manner which will become clear as the description proceeds, the logic processing circuit 11 fixes the first and the second word decoder output signals MWLBP and MWLBN to high and low levels, respectively, when the selection signal XMATSEL indicates that the word line SWL is substituted by the redundancy circuit.

The subsidiary word decoder (SW) 3 comprises a P-channel transistor Q9, five N-channel transistors Q10, Q11, Q12, Q13, and Q14, an inverter circuit (NV) 9, and a NAND circuit (NAND) 10. The subsidiary word decoder (SW) 3 is supplied with the first and the second main word decoder output signals MWLBP and MWLBN of the main word decoder (MW) 2, the word line start-up signal FXT, the inverted word line start-up signal FXB, and the bank address BA. The subsidiary word decoder (SW) 3 produces its output signal on the word line (SWL).

The P-channel transistor Q9 has a source supplied with the word line start-up signal FXT, a drain connected to a drain of the N-channel transistor Q10, and a gate supplied with the first main word decoder output signal MWLBP. The N-channel transistor Q10 has the drain connected to the drain of the P-channel transistor Q9, a source supplied with a ground potential VSS, and a gate supplied with the second main word decoder output signal MWLBN. The drains of the P-channel transistor Q9 and the N-channel transistor Q10 are connected to each other in common and connected to the word line (SWL) of the subsidiary word decoder 3. The P-channel transistor Q9 serves as a load transistor for driving the word line (SWL) to a high level. The N-transistor Q10 serves as a driver transistor for driving the word line (SWL) to a low level.

The N-channel transistor Q11 has a drain connected to the word line (SWL), a source connected to a drain of the N-channel transistor Q12, and a gate supplied with the inverted word line start-up signal FXB. The N-channel transistor Q12 has the drain connected to the source of the N-channel transistor Q11, and a source supplied with the ground potential VSS, and a gate connected to an output terminal of the NAND circuit (NAND) 10. The N-channel transistor Q13 has a drain connected to the word line (SWL), a source connected to a drain of the N-channel transistor Q14, and a gate supplied with the first main word decoder output signal MWLBP. The N-channel transistor Q14 has the drain connected to the source of the N-channel transistor Q13, a source supplied with the ground potential VSS, and a gate supplied with the bank address BA. The inverter circuit (INV) 9 has an input terminal supplied with the second main word decoder output signal MWLBN and an output terminal connected to an input terminal of the NAND circuit (NAND) 10. The NAND circuit (NAND) 10 is supplied with an output signal of the inverter circuit (INV) 9 and with the first main word driver output signal MWLBP. The NAND circuit (NAND) 10 has an output terminal connected a node D. The node D is connected to the gate of the N-channel transistor Q12.

A combination of the inverter circuit (INV) 9 and the NAND circuit (NAND) 10 serves as a logic circuit 12 for performing a logic processing on the first and the second main word decoder output signals MWLBP and MWLBN to produce a logic output signal. The logic output signal is supplied to the gate of the N-channel transistor Q12.

In the manner which will become clear as the description proceeds, a combination of the inverter circuit 9, the NAND circuit 10, the four N-channel transistors Q11 to Q14 serves as a state putting circuit 14 for putting the word line SWL into one of a high level, a low level, and a high impedance state.

Referring now to FIGS. 6 through 8, description will be made as regards operation of the semiconductor memory device according to the first embodiment of this invention.

Referring first to FIG. 6, operation of signals for selecting the word line (SWL) as a normal operation will be described. In order to select the word line (SWL), it is necessary that the first main word decoder output signal MWLBP of the main word decoder (MW) 2 becomes a low level, the second main word decoder output signal MWLBN of the main word decoder (MW) 2 becomes a low level, and the word line (SWL) becomes a high level.

When a DRAM is first used, the power supply of the DRAM is turned on. In this event, on turning the power on, the start-up reset signal PON changes from a low level to a high level and thereafter the start-up reset signal PON is turned back to the low level after a lapses of a predetermined time interval from a time instant when the power supply VPP reaches to a predetermined level. Responsive to the start-up reset signal PON, a flip-flop circuit consisting of the NOR circuits (NORs) 7 and 8 is reset and the node C becomes a high level which is an initial state. In addition, on turning the power on, address information stored in a fuse circuit (not shown) is read out, it is determined whether or not the memory cell is substituted by the redundancy circuit, and initialization is carried out whether the normal memory cell array is selected or the redundancy circuit is selected.

In the initial state, inasmuch as the precharge signal PRECH is a low level, the first and the second X-address predecoder output signals XPRED1 and XPRED2 are a low level, and the group selection signal XMATSEL is a high level, the node A is held to a high level. In this event, the node B is put into a low level. Accordingly, the first main word decoder output signal MWLBP becomes a high level in the initial state. In addition, inasmuch as the start-up reset signal PON is the low level and the node B is the low level, the node C at the output terminal of the NOR circuit (NOR) 7 becomes a high level. Inasmuch as the node C is the high level, the second main word decoder output signal MWLBN becomes a low level in the initial state. Although the start-up signal PON, which is a signal generated on start-up of the power, is used as an initialization signal, the initialization signal may be substituted by a signal of initialization for a memory such as a signal MRS.

When a memory data is read from the DRAM or written in the DRAM, a word line for the address in question is first activated and the word line in question changes from a low level to a high level. A time duration when the word line is activated is called an active duration. The precharge signal PRECH changes from the low level to a high level, the first and the second X-address predecoder output signals XPRED1 and XPRED2 change the low level to a high level, and the group selection signal XMATSEL changes from the high level to a low level. As a result, the node A changes from the high level to a low level, the node B changes the low level to a high level, and the node C changes from the high level to a low level. Accordingly, the first main word decoder output signal MWLBP changes from the high level to the low level and the second main word decoder output signal MWLBN holds the low level. The main word decoder produces a low level indicative of a selected state.

Next, operation of the subsidiary word decoder 3 will be described in the similar manner. The subsidiary word decoder (SW) 3 is supplied with the first and the second main word decoder output signals MWLBP and MWLBN, the bank address BA, the word line start-up signal FXT, and the inverted word line start-up signal FXB. After the power is turned on, the first and the second main word decoder output signals MWLBP and MWLBN are the high level and the low level, respectively. In addition, inasmuch as the node D is a low level, there is no transistor for driving the word line SWL. That is, the word line SWL becomes a high impedance and becomes a Hi-z level or an indefinite level.

Before the word line is activated, the bank address BA absolutely changes from a low level to a high level. When the band address BA is driven from the low level to the high level, both the N-channel transistors Q13 and Q14 are turned on, and then the word line SWL is driven to a low level. In the manner which is described above, after the initialization, the subsidiary word decoder (SW) 3 is supplied with the first and the second main word decoder output signals MWLBP and MWLBN having the low level from the main word decoder 2. Subsequently, the word line start-up signal FXT changes from the low level to a high level and the inverted word line start-up signal FXB changes from the high level to a low level. Inasmuch as the P-channel transistor Q9 is turned on, the N-channel transistors Q10, Q11, and Q13 are turned off, the word line SWL becomes a high level. That is, the word line is selected. In the manner which is described above, the selected word line SWL rises from the low level to a high level.

Although a basis operation is described in the above manner, operation of a path constituted by the N-channel transistors Q11 and Q12 will be described in reference with FIG. 4. The N-channel transistors Q11 and Q12 constitutes the path for selecting a plurality of subsidiary word decoders connected to the main word decoder in a case where the memory cell is not substituted by the redundancy circuit. In FIG. 4, the first and the second subsidiary word decoders (SWs) 13-1 and 13-2 are connected to the main word decoder (MW) 2. In the manner which is described above, in general, the first and the second main word decoded output signals MWLBP and MWLBN are supplied to the plurality of subsidiary word decoders. The N-channel transistors Q11 and Q12 constitutes the path for selecting activity/inactivity of the plurality of subsidiary word decoders in response to the first and the second word line start-up signals FXT-1 and FXT-2 and the first and the second inverted word line start-up signals FXB-1 and FXB-2.

The first and the second subsidiary word decoders 3-1 and 3-2 are supplied with the first and the second main word decoder output signals MWLBP and MWLBN and the bank address BA in common. In addition, the first subsidiary word decoder 3-1 is supplied with the first word line start-up signal FXT-1 and the first inverted word line start-up signal FXB-1. The second subsidiary word decoder 3-2 is supplied with the second word line start-up signal FXT-2 and the second inverted word line start-up signal FXB-2. It will be assumed that the first word line SWL-1 is put into a selected activated state. In this event, the first word line start-up signal FXT-1 is a high level, the second word line start-up signal FXT-2 is a low level, the first inverted word line start-up signal FXB-1 is a low level, and the second inverted word line start-up signal FXB-2 is a high level. On the other hand, it is necessary that the second word line SWL-2 becomes a low level and a portion for driving the second word line SWL-2 to the low level is required. Under the circumstances, the second word lien SWL-2 is made to the low level by a series connection of the N-channel transistor Q11 supplied with the second inverted word line start-up signal FXB-2 of the high level and the N-channel transistor Q12 supplied with the logic output signal having the high level from the node D.

Now, the description will be made as regards operation of inactivity of the word line, that is, operation in a case where the selected word line SWL makes from a high level to a low level as a reset operation. The operation of inactivity of the word line is opposite to operation of activity of the word line. The description will be made in turn. The first and the second X-address predecoder output signals XPRED1 and XPRED2 change from the high level to the low level and the group selection signal XMATSEL changes the low level to the high level. After the first and the second predecoder output signals XPRED1 and XPRED2 are changed to the low level, the precharge signal PRECH changes from the high level to the low level. Responsive to this operation, the node A changes from the low level to the high level and the node B changes from the high level to the low level.

The node C is held to the low level. As a result, the first and the second main word decoder output signals MWLBP and MWLBN are driven from the low level to the high level. At substantially the same time instant when the first and the second main word decoder output signals MWLBP and MWLBN are driven to the high level, the word line start-up signal FXT is driven from the high level to the low level and the inverted word line start-up signal FXB is driven from the low level to the high level. As a result, the word line SWL is driven from the high level to the low level. Thereafter, the bank address BA is driven from the high level to the low level.

Referring now to FIGS. 4, 5, 7 and 8, the description will be made as regards operation in a case where there is a short failure (a cross failure) between the word line SWL and the bit line BLT. It is understood in the case where there is the short failure, by comparison with FIG. 6 and FIG. 7, that the precharge signal PRECH, the first and the second X-address predecoder output signals XPRED1 and XPRED2, the bank address BA, the word line start-up signal FXT, the inverted word line start-up signal FXB have similar operation waveforms. In the case where there is the short failure, a level of the word line SWL becomes the indefinite level or the Hi-z level except during the bank address BA becomes the high level or during the bank address BA becomes the low level.

In order to make the word line SVVL the Hi-z level, the group selection signal XMATSEL is fixed to the high level as the initialization on turning the power on. In an address where there is a defect, a redundancy selection (operation for carrying out substitution for a redundant word line) is started by a signal from the fuse circuit and the group selection signal XMATSEL is stopped from starting in response to this operation and is fixed to the high level. The signal from the fuse circuit is prepared by taking a test whether there is a defect in which of addresses by a backup wafer probe test (or redundancy determination wafer test) and by making the fuse circuit store the address in question. These setting is carried out as initialization when the power is turned on. This information is held in the device.

When the group selection signal XMATSEL is held in the high level, the node A is held in the high level, the node B is held in the low level, and the node C is held in the high level. As a result, the first main word decoder output signal MWLBP is held in the high level, the second main word decoder output signal MWLBN is held in the low level, and the node D remains to hold the low level. Accordingly, except during the bank address BA is the high level, the word line SWL becomes the indefinite or the Hi-z level.

FIGS. 8A and 8B show operation waveforms of the word line SWL in detail. FIG. 8A shows an operation waveform of the word line which is substituted by the redundancy circuit and is not selected because there is the defect. FIG. 8B shows another operation waveform of the word line which is selected because there is no defect. The word line with the defect (short failure) has the indefinite level (the Hi-z level) except during a word line with no defect is activated. In this event, there is the short failure between the word line and the bit line and then the word line and the bit line cause a short. Therefore, the word line changes to the precharge potential level VBLP which is a level on standby of the bit line. During the word line is selected, the word line with the defect is driven to the ground potential level VSS.

More specifically, a duration when the word line with the defect is held in the ground potential VSS includes the active duration when the word line is driven and is longer than the active duration. This is required for the non-selected word line in question to never happen loss of a readout signal caused by couple noises due to a capacitance coupling to an array portion when the non-selected word line in question changes from the precharge potential level VBLP to the ground potential level VSS. This duration may be a short duration corresponding to a time duration when the non-selected word line in question changes to the ground potential level VSS. Herein, a time duration when the word line is driven is called an active duration while a time duration when the bank address BA is inactivated is a standby duration.

Now, the description will proceed to a method of detecting that the bit line and the word line take a short with a high resistance. For example, it is possible to detect a short by setting the semiconductor memory device to a dedicated test mode by the MRS signal and by floating the non-selected word line by an external command. More specifically, cell data "High" are written in all memory cells. Thereafter, word lines are floated by the MRS signal and a suitable standby duration is put. When there is a short between a word line and a bit line, the word line becomes the precharge potential level VBLP which is similar to that of the bit line. Herein, the precharge potential level VBLP of the bit line is a potential higher than a threshold potential Vth of a transistor in a memory cell.

Thereafter, the memory cells are accessed to read cell data. In this event, when both of memory cells of a bit line pair are read one after another, the bit line becomes 0 volt in either of twice (one of the bit line pair becomes High while another of the bit line pair becomes Low because the memory cells are refreshed). If there are that takes a short to the bit line in the word lines which are not accessed, a level of cell High becomes Low (0 volt) because the word line becomes the precharge potential level VBLP higher than Vth. Thereafter, although the bit line becomes a High state in the precharge state, the memory cell does not become a level higher than VBLP-Vth. Thereafter, when the memory cell is accessed, it is decided that the word line which takes a short to the bit line is a cell Low and it is understood that there is a short between the word line and the bit line. Such defective word lines are substituted in units of the main word line.

According to the first embodiment of this invention, the word line of the standby state of the memory cell array, that is short failure and is substituted by the redundancy circuit, makes the high impedance (Hi-z) state. Therefore, although the word line increases up to the precharge potential of the bit line, a stationary short current does not flow. It is therefore to provide the semiconductor memory device which is capable to decreasing a standby current by including a word line driving circuit for making the word line of the standby state the high impedance (Hi-z) state.

Referring to FIG. 9, the description will proceed to a semiconductor memory device according to a second embodiment of this invention. FIG. 9 is a block diagram showing a word line driving circuit comprising a main word decoder and a subsidiary word decoder for use in the semiconductor memory device according to the second embodiment of this invention. The illustrated word line driving circuit is similar in structure and operation to the word line driving circuit illustrated in FIG. 5 except that the main word decoder is modified from that illustrated in FIG. 5 as will later become clear. The main word decoder is therefore depicted at 61. Inasmuch as the subsidiary word decoder is similar in structure and operation to the subsidiary word decoder 3 illustrated in FIG. 5, those having similar function are depicted at the same reference symbols and the description thereof is omitted.

The main word decoder 61 comprises an X-address predecode portion (PRE-D) 62. The X-address predecode portion (PRE-D) 62 comprises a three-input NAND circuit (NAND) 63 and an inverter circuit (INV) 64. The three-input NAND circuit (NAND) 63 is supplied with three X-address predecode signals XPRED61, XPRED62, and XPRED63 from an X-address predecoder (not shown). The three-input NAND circuit (NAND) 63 delivers an output signal to the inverter circuit (INV) 64. The inverter circuit (INV) 64 produces an output signal as an output signal of the X-address predecode portion (PRE-D) 62. A concrete circuit structure of the X-address predecoder may particularly be not restricted.

The main word decoder 61 further comprises an inverter circuit (INV) 65, a NAND circuit 66, and a NOR circuit 67. The output signal of the X-address predecode portion (PRE-D) 62 is supplied to the NAND circuit (NAND) 66 and the NOR circuit (NOR) 67. The NAND circuit (NAND) 66 is also supplied with a signal in which a selection signal MODE is inverted by the inverter circuit (INV) 65. The NAND circuit (NAND) delivers the first main word decoder output signal MWLBP to the subsidiary word decoder 3. The NOR circuit (NOR) 67 is also supplied with the selection signal MODE. The NOR circuit (NOR) 67 delivers the second main word decoder output signal MWLBN to the subsidiary word decoder 3.

The selection signal MODE is a signal for disabling the main word decoder which activates the word line having a short failure. Initialization on turning the power on is carried out by reading address information stored in a fuse circuit (not shown) and by determining whether or not the memory cell array is substituted by the redundancy circuit. The selection signal MODE may be stored in fuses such as a metal FUSE or an anti-FUSE (an electrical FUSE). A method of storing and preparing the selection signal MODE may particularly be not restricted. The main word decoder (MW) 61 may have structure where the first main word decoder output signal MWLBP is fixed to the high level and the second main word decoder output signal MWLBN is fixed to the low level in response to the selection signal MODE when there is a short failure in the word line SWL and a malfunction current flows in the word line SWL.

A combination of the inverter circuit 65, the NAND circuit 66, and the NOR circuit 67 serves as a logic processing circuit 11A for performing a logic processing on the predecoder output signals XPRED61, XPRED62, XPRED63 on the basis of the selection signal MODE to produce the first and the second main word decoder output signals MWLBP and MWLBN. In the similar manner of the logic processing circuit 11 in the main word decoder (MW) 2 illustrated in 5, the logic processing circuit 11A fixes the first and the second main word decoder output signals MWLBP and MWLBN to high and low levels, respectively, when the selection signal MODE indicates that the word line SWL is substituted by the redundancy circuit.

Accordingly, the main word decoder (MW) 61 produces the first and the second main word decoder output signals MWLBP and MWLBN in the manner similar to that of the main word decoder (MW) 2 illustrated in FIG. 5. Inasmuch as the subsidiary word decoder (SW) 3 supplied with the first and the second main word decoder output signals MWLBP and MWLBN is similar in structure to the subsidiary word decoder (SW) 3 illustrated in FIG. 5, the word line driving circuit illustrated in FIG. 9 operates and has merits similar to the word line driving circuit illustrated in FIG. 5. It is possible to make the word line of the standby state the high impedance (Hi-z) state. It is possible to reduce the standby current of the semiconductor memory device by comprising the word line driving circuit for making the word line of the standby state the high impedance (Hi-z) state.

Although this invention has been described as the first and the second embodiments, the main word decoder and the subsidiary word decoder may have various circuit configurations without going out of the gist (subject matters) of the present invention. Although the short failure between the word line and the bit line is substituted by the redundancy circuit and the defective word line is put into the high impedance state in the above embodiments, all of word lines substituted by the redundancy circuit may be applied. It is considerably difficult to find the short failure between the word line and the bit line. For example, when the short failure has a high resistance, it appears a lack of operation margin without appearing remarkable failure of the word line because of the high resistance. However, there is a high probability that such a failure evolves into the short failure because the memory cell is used for a long time, a current flows in the failure whenever the word line is activated, and the resistance gradually decreases. It is desirable to substitute by the redundancy circuit by initially finding such a failure. It is possible to maintain reliability of the semiconductor memory device because reduction of resistance is inhibited by making the word line the high impedance.

In the present invention, the word line of the memory cell array which is substituted by the redundancy circuit because of the short failure is put into the high impedance (Hi-z) state on standby. Accordingly, although the word line increases up to the precharge potential of the bit line shorted thereto, a stationary short current does not flow. This invention provides the semiconductor memory device which is capable of reduce the standby current by including the word line driving circuit for making the word line of the standby state the high impedance (Hi-z) state.

While this invention has thus far been described in conjunction with a few embodiments thereof, it will readily be possible for those skilled in the art to put this invention into practice in various other manners.

What is claimed is:

1. A semiconductor memory device comprising:
a memory cell connected to a word line and a bit line; and
a word line driving circuit for driving the word line, wherein said word line driving circuit comprises:
a main word decoder for producing first and second main word decoder output signals; and
a subsidiary word decoder including a load transistor and a driver transistor, said load transistor having a gate supplied with the first main word decoder output signal, said driver transistor having a gate supplied with the second main word decoder output signal, said subsidiary word decoder comprising a state putting circuit for putting said word line into one of a high level, a low level, and a high impedance state.

2. The semiconductor memory device as claimed in claim 1, wherein said state putting circuit puts said word line into the high impedance state during a standby duration when said word line is connected to the memory cell substituted by a redundancy circuit.

3. The semiconductor memory device as claimed in claim 2, wherein said state purring circuit puts said word line into the low level for a duration when a bank address is activated.

4. The semiconductor memory device as claimed in claim 3, wherein said duration when the bank address is activated includes an active duration when the word line of the memory cell is activated.

5. The semiconductor memory device as claimed in claim 3, wherein said state putting circuit comprises first and second transistors connected in series between the word line and a ground potential, said first transistor having a gate supplied with the first main word driver output signal, said second transistor having a gate supplied with the bank address.

6. The semiconductor memory device as claimed in claim 1, wherein said main word decoder is supplied with predecoder output signals from a predecoder circuit and with a selection signal indicating whether the memory cell is substituted by a redundancy circuit, said main word decoder comprising a logic processing circuit for performing a logic processing on said predecoder output signals on the basis of the selection signal to produce the first and the second main word decoder output signals, said logic processing circuit fixing the first and the second main word decoder output signals to high and low levels, respectively, when said selection signal indicates that the word line is substituted by the redundancy circuit.

7. The semiconductor memory device as claimed in claim 6, wherein said logic processing circuit produces the first and the second main word decoder output signals each having a low level when said selection signal indicates that the ward line is not substituted by the redundancy circuit and when said predecoder output signals indicate a selection state, said subsidiary word decoder driving the word line in response to a word line start-up signal and an inverted word line start-up signal.

8. The semiconductor memory device as claimed in claim 7, wherein
said load transistor has a source supplied with the word line start-up signal, a drain connected to the word line, and a gate supplied with the first output signal,
said driver transistor has a drain connected to the word line, a source supplied with a ground potential, and a gate supplied with the second output signal,
wherein the state putting circuit in said subsidiary word driver comprises:
a logic circuit for performing a logic processing on the first and the second main word decoder output signal to produce a logic output signal;
a first N-channel transistor having a drain connected to the word line and a gate connected to the inverted word line start-up signal; and
a second N-channel transistor having a drain connected to a source of the first N-channel transistor, a source supplied with the ground potential, and a gate supplied with the logic output signal.

9. The semiconductor memory device as claimed in claim 6, wherein said selection signal is prepared by address information stored in a fuse circuit of the redundancy circuit.

* * * * *